(12) United States Patent
Matsuda

(10) Patent No.: US 6,599,617 B2
(45) Date of Patent: Jul. 29, 2003

(54) ADHESION STRENGTH BETWEEN CONDUCTIVE PASTE AND LANDS OF PRINTED WIRING BOARD, AND MANUFACTURING METHOD THEREOF

(75) Inventor: Yoshinari Matsuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/891,841

(22) Filed: Jun. 26, 2001

(65) Prior Publication Data
US 2002/0160165 A1 Oct. 31, 2002

(30) Foreign Application Priority Data
Apr. 25, 2001 (JP) .......................... 2001-127625

(51) Int. Cl.⁷ ................................ B32B 3/00
(52) U.S. Cl. ......................................... 428/209
(58) Field of Search .......................... 428/209

(56) References Cited

U.S. PATENT DOCUMENTS

| | | | | |
|---|---|---|---|---|
| 4,387,006 A | * | 6/1983 | Kajiwara et al. | 205/111 |
| 5,444,189 A | * | 8/1995 | Nakaso et al. | 174/255 |
| 6,376,052 B1 | * | 4/2002 | Asai et al. | 428/209 |
| 6,420,017 B1 | * | 7/2002 | Matsuda et al. | 428/209 |

* cited by examiner

Primary Examiner—Deborah Jones
Assistant Examiner—G. A. Blackwell-Rudasill
(74) Attorney, Agent, or Firm—Jay H. Maioli

(57) ABSTRACT

Copper foil lands provided with a through-hole filled with a copper paste are provided with ring-formed hollow portions in the periphery of the through-hole where exfoliation between the copper paste and the copper foil lands normally occurs to obtain a copper-plated through-hole in both sides of a printed wiring board using a paper-phenol substrate, wherein adhesion strength between the copper foil lands and the copper paste is enhanced.

2 Claims, 9 Drawing Sheets

THERMAL EXPANSION AND CONTRACTION CHARACTERISTICS OF PAPER-PHENOL SUBSTRATE

ADHESION STRENGTH BETWEEN CONDUCTIVE PASTE AND LANDS OF PRINTED WIRING BOARD, AND MANUFACTURING METHOD THEREOF

BACKGROUND OF THE INVENTION

The present invention relates to a printed wiring board formed by adhering a metallic foil such as a copper foil to both sides of a laminate comprising a paper substrate, for example, a paper-phenol material as a base, and to a method of manufacturing the same.

Hitherto, printed wiring boards utilized for wiring in various electronic apparatuses include those ones in which copper foil lands for a plated-through hole provided on both sides are electrically connected in order to enhance the mounting density.

As one of techniques for connecting by a plated-through hole, there is a technique in which a crude hole for plated-through hole is filled with a conductive paste, whereby copper foil lands provided on both sides of the printed wiring board are electrically connected. Among others, those printed wiring boards in which a plated-through hole is formed by using a copper paste obtained by kneading a fine copper powder and a thermosetting resin as the conductive paste are called, for example, copper paste plated-through hole printed wiring boards.

In the case of producing the copper paste plated-through hole printed wiring board as mentioned above, for example, copper foil lands for plated-through hole are provided on both sides of a base substrate to be a base of the printed wiring board, and thereafter a crude hole for the plated-through hole is formed in the copper foil lands. Then, the crude hole is filled with the copper paste, followed by drying and curing to obtain a copper paste plated-through hole.

However, the copper paste plated-through hole printed wiring board as mentioned above has had the problem that the surfaces of the copper foil lands provided on both sides are flat and, accordingly, the adhesion strength between the copper foil lands and the copper paste is weak.

In consideration of the above situation, the present applicant et al. have proposed a printed wiring board in which the adhesion strength between a copper paste and copper foil lands is enhanced such as by forming a hollow portion in the surface of the copper foil lands for plated-through hole (Japanese Patent Laid-open No. Hei 10-206277).

In ordinary printed wiring boards, for example, a paper-phenol substrate, a paper-epoxy substrate, a paper composite substrate and the like can be utilized as a base substrate. However, in copper paste plated-through hole printed wiring boards, the paper-phenol substrate cannot be utilized because of the following production problems.

For example, in production process of a copper paste plated-through hole printed wiring board, as shown in FIG. 15, copper foil lands 101 for plated-through hole are provided on both sides of a base substrate 100, and a crude hole 102 for the plated-through hole is bored in the copper foil lands 101. Then, the crude hole 102 is filled with a copper paste 103, followed by a drying step at about 60 to 100° C. and a thermal curing step at 150 to 160° C., thereby forming a copper paste plated-through hole.

In such a production process, however, when a paper-phenol substrate is used as the base substrate 100, volatile components contained in the base material resin of the paper-phenol substrate such as methanol, 1-butanol, 2-methyl-1-propanol, formaldehyde, toluene, salicylaldehyde and the like and water contained in the paper material are generated as out gases in the drying step and the thermal curing step.

The out gases generate a burst (blister) 104 shown in FIG. 15 or bubbles 105 shown in FIG. 16 in the copper paste 103 filling the crude hole 102 of the base substrate 100, causing substrate defects.

In consideration of the above situations, the present applicant et al. have studied intensively for preventing the burst 104 and the bubbles 105 which would be generated in the copper paste 103, and have proposed a printed wiring board in which, for example, a through-hole for discharging the gases is provided in the vicinity of a via hole formed by filling with the copper paste 103 (Japanese Patent Laid-open No. Hei 11-177497).

In recent years, attendant on reductions in the cost of various electronic apparatuses, there has been an increasing demand for reduction in the cost of copper paste plated-through hole printed wiring boards.

Therefore, also in the copper paste plated-through hole printed wiring boards, it is desired to form the base substrate from a paper-phenol based substrate material which is available most inexpensively and easily.

In consideration of the above situations, the present applicant et al. have again studied whether or not the copper paste plated-through hole printed wiring board can be formed by use of the paper-phenol substrate 100.

As a result, the present applicant et al. have found that, in the case of producing a copper paste plated-through hole printed wiring board by the previously proposed invention (Japanese Patent Laid-open No. Hei 10-206277), a sufficient adhesion strength has not yet been obtained between the copper foil lands 101 and the copper paste 103 for the following reasons.

FIG. 17 shows an example of structure obtained where a copper paste plated-through hole printed wiring board is formed by use of a paper-phenol substrate as a base substrate.

The copper paste plated-through hole printed wiring board shown in FIG. 17 comprises a base substrate 100 formed of a paper-phenol substrate, and copper foil lands 101 provided on both sides of the base substrate 100. Then, a crude hole 102 for plated-through hole is bored in the copper foil lands 101, and the crude hole 102 is filled with a copper paste 103, followed by drying and curing to produce a copper paste plated-through hole.

In the case of producing the copper plated-through hole printed wiring board in the manner as mentioned above, a destructive test of solder heat resistance and the like after moisture absorption conducted as evaluation of reliability of the wiring board results in that exfoliation 106 is generated between the copper foil lands 101 formed in the periphery of the crude hole 102 and the copper paste 103.

Particularly, when the case where a both side copper-clad laminate with a paper substrate such as a paper-phenol substrate as a base is used as the base substrate 100 was compared with the case where a both side copper-clad laminate with a glass substrate such as a glass-epoxy substrate is used as the base substrate 100, it was found that the exfoliation 106 at the interface between the copper paste 103 and the copper foil lands 101 is generated more easily in the case of the both side copper-clad laminate using the paper substrate as a base.

The exfoliation 106 generated at the interface between the copper paste 103 and the copper foil lands 101 is said to be due to the difference in thermal expansion and contraction characteristics between the both side copper-clad laminate with the paper substrate as a base and the both side copper-clad laminate with the glass substrate as a base.

Here, the thermal expansion and contraction characteristics of the paper-phenol substrate are shown in FIG. 13, whereas the thermal expansion and contraction characteristics of the glass-epoxy substrate are shown in FIG. 14.

The thermal expansion and contraction characteristics shown in FIGS. 13 and 14 are measured by the so-called TMA method in which a specimen is heated up from room temperature at a rate of 10° C./min and coefficient of thermal expansion in the thickness direction is measured on a thermal analysis apparatus.

When the thermal expansion and contraction characteristics shown in FIGS. 13 and 14 are compared with each other, it is seen that the paper-phenol substrate shown in FIG. 13 shows a greater size change coefficient in the thickness direction relative to the heating temperature change, as compared with the glass-epoxy substrate shown in FIG. 14.

This means that the glass-epoxy substrate has a lower coefficient of thermal expansion in the thickness direction and a smaller moisture absorption of base material whereas the paper-phenol substrate has a higher coefficient of thermal expansion in the thickness direction and a larger moisture absorption of base material.

As a result, in the case of forming the copper plated-through hole printed wiring board by using the paper-phenol substrate as the base substrate 100, the expansion stress at the time of solder heat resistance is greater as compared with the case of using the glass-epoxy substrate, and exfoliation 106 is generated between the copper foil lands 101 and the copper paste 103.

Particularly, it was found that the exfoliation 106 would easily occur between the copper foil lands 101 in the periphery of the crude hole 102 and the copper paste 103.

Accordingly, in order to produce a copper paste plated-through hole printed wiring board by using a paper-phenol based substrate material which is available most inexpensively and easily, it has been required to further enhance the adhesion strength between the copper foil lands and the copper paste by preventing the exfoliation between the copper foil lands and the copper paste which would occur in the periphery of the crude hole for plated-through hole.

SUMMARY OF THE INVENTION

The present invention has been made in consideration of the above-mentioned situations.

According to an aspect of the present invention, there is provided a printed wiring board formed by adhering a metallic foil to both sides of a laminate comprising a paper substrate, wherein metallic foil lands provided on both sides of the paper substrate and provided with a through-hole to be filled with a conductive paste are each provided with a metallic foil removed portion of a predetermined shape in contact with at least a portion of the through-hole.

According to the printed wiring board of the present invention as above-mentioned, since the metallic foil removed portion is provided in the periphery of the through-hole where exfoliation of the metallic foil lands would hitherto occur easily, the conductive paste would not easily be exfoliated from the metallic foil lands, and the adhesion strength between the metallic foil lands and the conductive paste can be enhanced.

In addition, according to another aspect of the present invention, there is provided a method of manufacturing a printed wiring board formed by adhering a metallic foil to both sides of a laminate comprising a paper substrate comprises the steps of: forming metallic foil lands on both sides of a both side metallic foil clad laminate; providing each of the metallic foil lands with a metallic foil removed portion of a predetermined shape; forming a through-hole in the metallic foil lands; and filling the through-hole with a conductive paste and drying and curing the filled conductive paste.

According to the method of manufacturing a printed wiring board of the present invention, the step of forming the metallic foil lands and the step of providing the metallic foil lands with a metallic foil removed portion of a predetermined shape can be carried out simultaneously by only changing a resist pattern, and, therefore, it is possible to provide the metallic foil lands with a metallic foil removed portion of a predetermined shape without increasing the number of manufacturing steps.

The above and other objects, features and advantages of the present invention will become apparent from the following description and appended claims, taken in conjunction with the accompanying drawings which show by way of example some preferred embodiments of the invention.

DETAILED DESCRIPTION OF THE PREFERRED EMBODIMENTS

Now, modes for carrying out the present invention will be described below.

In the present embodiment, an example of the case where a paper-phenol substrate formed by impregnating a paper substrate with a phenol resin, for example, is used as a printed wiring board will be described.

The plated-through hole herein includes not only a plated-through hole utilized for electrical connection of the metallic foil lands such as copper foil lands provided on both sides of a substrate and for insertion of component part leads but also the so-called via hole used for only electrical connection of the metallic foil lands.

Figure 1:
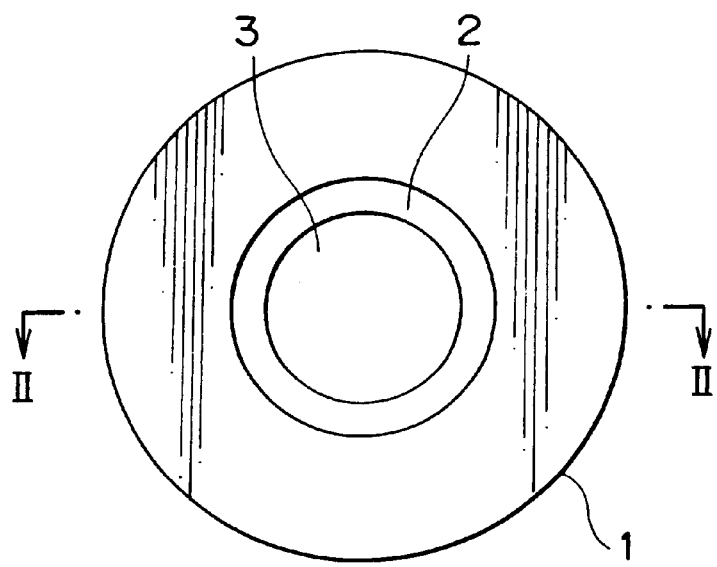
FIG. 1 is a top plan view schematically showing the structure of a printed wiring board according to a first embodiment of the present invention, before formation of plated-through hole.
Figure 2:
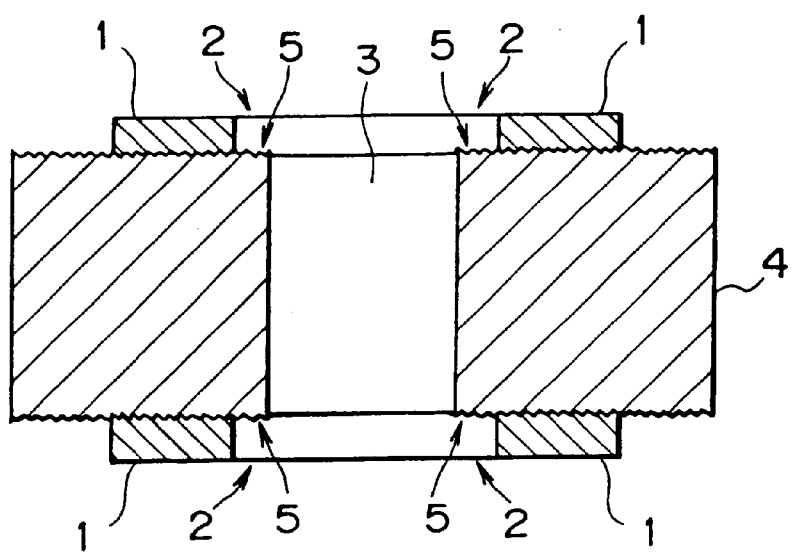
FIG. 2 is a sectional view taken along arrow II—II of the printed wiring board shown in FIG. 1.

FIG. 1 is a top plan view showing schematically the structure of a printed wiring board according to a first embodiment of the present invention, before formation of a plated-through hole. FIG. 2 is a sectional view taken along arrow II—II of the printed wiring board shown in FIG. 1.

As shown in FIGS. 1 and 2, the printed wiring board according to the first embodiment comprises copper foil lands 1 for plated-through hole provided on both sides of a paper-phenol substrate 4.

The surfaces of the paper-phenol substrate 4 are rough surfaces 5, whereby enhanced adhesion strength between the paper-phenol substrate 4 and the copper foil lands 1 is contrived.

The copper foil lands 1 are formed in a ring shape, and a through-hole (crude hole) 3 for plated-through hole is provided in the center of each of the copper foil lands 1. In the periphery of the through-hole 3, ring-formed hollow portions 2 are provided in contact with the through-hole 3.

The ring-formed hollow portions 2 are formed by removing the copper foil lands 1 provided on both sides of the paper-phenol substrate 4 by, for example, etching, and the rough surface 5 of the paper-phenol substrate 4 is exposed at the bottom surfaces of the hollow portions 2.

Figure 3:
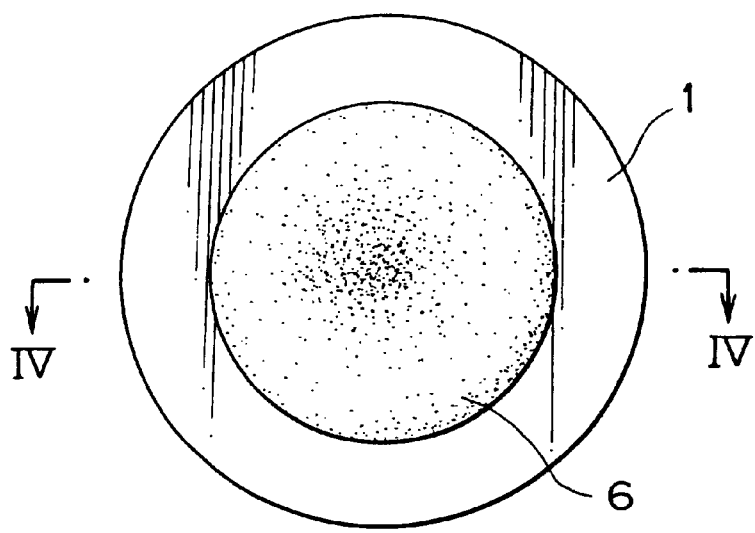
FIG. 3 is a top plan view schematically showing the structure of the printed wiring board according to the first embodiment of the present invention, after the formation of the plated-through hole.
Figure 4:
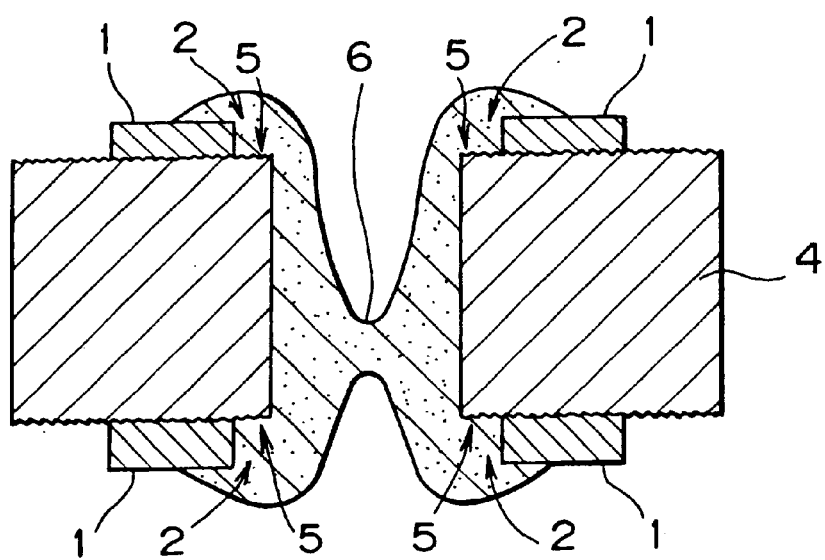
FIG. 4 is a sectional view taken along arrow IV—IV of the printed wiring board shown in FIG. 3.

FIG. 3 is a top plan view schematically showing the structure of a printed wiring board according to the first embodiment, after the formation of the plated-through hole. FIG. 4 is a sectional view along arrow IV—IV of the printed wiring board shown in FIG. 3.

The printed wiring board shown in FIGS. 3 and 4 is obtained by filling the through-hole 3 shown in FIGS. 1 and 2 with a copper paste 6, followed by drying and thermal curing to form a plated-through hole electrically connecting the copper foil lands 1 provided on both sides of the paper-phenol substrate 4.

In this case, the copper paste 6 filling the ring-formed hollow portions 2 formed in the periphery of the through-hole 3 is cured in adhesion to the rough surfaces 5 of the paper-phenol substrate 4 constituting the bottom surfaces of the ring-formed hollow portions 2.

The copper paste 6 is prepared by kneading a copper powder as a conductive material and a thermosetting resin as a binder.

In this case, the phenol resin of the paper-phenol substrate 4 and the binder resin of the copper paste 6 are comparatively good in property of adhesion to each other.

In addition, since the bottom surfaces of the ring-formed hollow portions 2 are the rough surfaces 5, the adhesion strength between the copper paste 6 and the paper-phenol substrate 4 becomes further rigid due to an anchoring effect.

Furthermore, since the ring-formed hollow portions 2 formed by removing a copper foil are provided in the periphery of the through-hole 3 where exfoliation between the copper foil lands 1 and the copper paste 6 would hitherto easily occur, there is low possibility of exfoliation between the copper paste 6 and the copper foil lands 1.

Therefore, according to the printed wiring board of the first embodiment, the adhesion strength between the copper paste 6 and the copper foil lands 1 is enhanced; for example, the copper paste 6 is not exfoliated from the copper foil lands 1 in a destructive test of solder heat resistance after moisture absorption, and reliability of connection between the copper paste 6 and the copper foil lands 1 can be largely enhanced.

By this, a copper plated-through hole printed wiring board utilizing an inexpensive paper-phenol substrate 4 can be realized.

Figure 5:
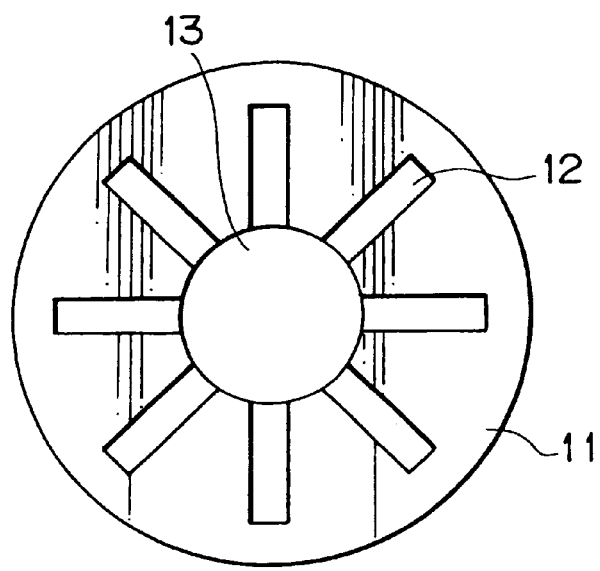
FIG. 5 is a top plan view schematically showing the structure of a printed wiring board according to a second embodiment, before formation of plated-through hole.

FIG. 5 is a top plan view schematically showing the structure of a printed wiring board according to a second embodiment of the present invention, before formation of a plated-through hole.

As shown in FIG. 5, in the printed wiring board according to the second embodiment, again, the copper foil lands 11 are ring-formed in shape, and a through-hole 13 for plated-through hole is provided in the center of the copper foil lands 11.

In addition, the copper foil land 11 is provided with, for example, eight groove portions (slits) 12 formed radially from the position for contact with the through-hole 13.

These slits 12 are copper foil removed portions formed by removing the copper foil lands 11 on both sides of the paper-phenol substrate 4 by etching, and the rough surface 5 of the paper-phenol substrate 4 is exposed at the bottom surface of each of the slits 12, as shown in FIG. 2 above.

Though not shown, the through-hole 13 is filled with a copper paste 6, followed by drying and thermal curing to thereby form a plated-through hole which electrically connects the copper foil lands 11 provided on both sides of the paper-phenol substrate 4.

At this time, the copper paste 6 filling the slits 12 formed radially from the through-hole 13 is also cured in adhesion to the rough surfaces of the paper-phenol substrate 4 constituting the bottom surfaces of the slits 12.

In this case, also, the phenol resin of the paper-phenol substrate 4 and the binder resin of the copper paste 6 are comparatively good in property of adhesion to each other, and the bottom surfaces of the slits 12 are the rough surfaces 5 offering an anchoring effect, whereby adhesion strength between the copper paste 6 and the paper-phenol substrate 4 becomes further rigid.

Furthermore, since the slits 12 are formed in contact with the through-hole 13 where exfoliation between the copper foil lands 11 and the copper paste 6 would hitherto easily occur, there is no possibility of exfoliation between the copper paste 6 and the copper foil lands 11.

Therefore, where the printed wiring board is produced in such a manner as described above, also, the adhesion strength between the copper paste 6 and the copper foil lands 11 is enhanced, and there would be no exfoliation between the copper paste 6 and the copper foil lands 11, so that the reliability of connection between the copper paste 6 and the copper foil lands 11 can be enhanced, and it is possible to realize a copper plated-through hole printed wiring board utilizing the inexpensive paper-phenol substrate 4.

Figure 6:
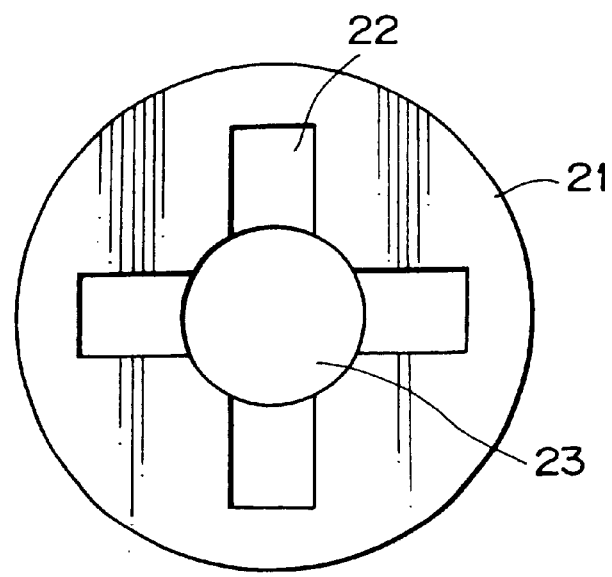
FIG. 6 is a top plan view schematically showing the structure of a printed wiring board according to a third embodiment, before formation of plated-through hole.

FIG. 6 is a top plan view schematically showing the structure of a printed wiring board according to a third embodiment of the present invention, before formation of a plated-through hole.

As shown in FIG. 6, in the printed wiring board according to the third embodiment, also, the copper foil lands 21 are ring-formed in shape, a through-hole 23 for plated-through hole is provided in the center of the copper foil lands 21, and, for example, four hollow portions 22 are provided in contact with the through-hole 23.

These hollow portions 22 are also formed by removing the copper foil lands 21 provided on both sides of the paper-phenol substrate 4 by etching, and rough surfaces 5 of the paper-phenol substrate 4 are exposed at the bottom surfaces of the hollow portions 22, in the same manner as in FIG. 2.

In addition, though not shown, the through-hole 23 is filled with a copper paste 6, followed by drying and thermal curing to thereby form a plated-through hole which electrically connects the copper foil lands 21 provided on both sides of the paper-phenol substrate 4.

At this time, the copper paste 6 filling the hollow portions 22 formed in contact with the through-hole 23 is also cured in adhesion to the rough surfaces 5 of the paper-phenol substrate 4 constituting the bottom surfaces of the hollow portions 22.

In this case, also, the phenol resin of the paper-phenol substrate 4 and the binder resin of the copper paste 6 are comparatively good in property of adhesion to each other, and the bottom surfaces of the hollow portions 22 are the rough surfaces 5 offering an anchoring effect, whereby the adhesion strength between the copper paste 6 and the paper-phenol substrate 4 becomes further rigid.

Furthermore, since the hollow portions 22 are formed in contact with the through-hole 23 where exfoliation between the copper foil lands 21 and the copper paste 6 would hitherto easily occur, there is no possibility of exfoliation between the copper paste 6 and the copper foil lands 21.

Therefore, in the case of producing the printed wiring board in this manner, also, the adhesion strength between the copper paste 6 and the copper foil lands 21 is enhanced, and the copper paste 6 would not be exfoliated from the copper foil lands 21, so that the reliability of connection between the copper paste 6 and the copper foil lands 21 can be enhanced, and it is possible to realize a copper plated-through hole printed wiring board utilizing the inexpensive paper-phenol substrate 4.

Figure 7:
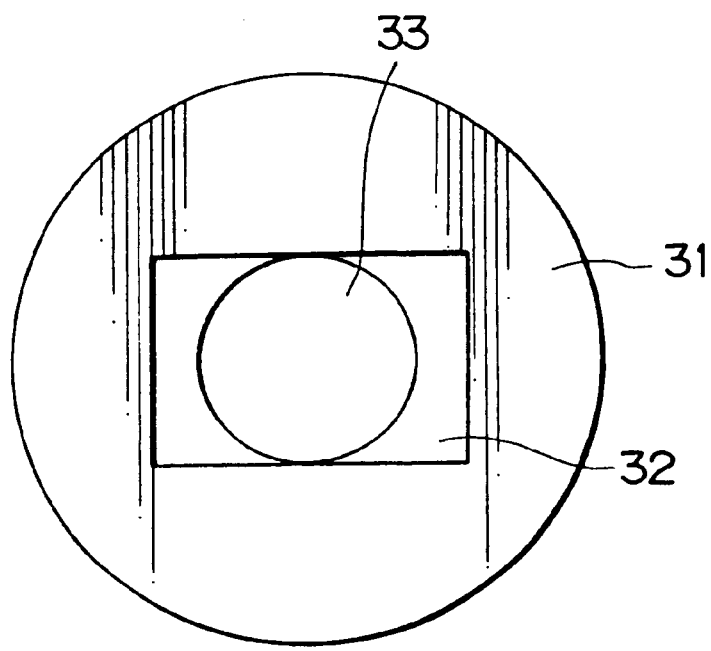
FIG. 7 is a top plan view schematically showing the structure of a printed wiring board according to a fourth embodiment, before formation of plated-through hole.

FIG. 7 is a top plan view schematically showing the structure of a printed wiring board according to a fourth embodiment of the present invention, before formation of a plated-through hole.

As shown in FIG. 7, in the printed wiring board according to the fourth embodiment, also, copper foil lands 31 are ring-formed in shape, a through-hole 33 for plated-through hole is provided in the center of the copper foil lands 31, and rectangular hollow portions 32 are provided in the periphery of the through-hole 33.

The rectangular hollow portions 32 are also formed by removing the copper foil lands 31 provided on both sides of a paper-phenol substrate 4 by etching, and rough surfaces 5 of the paper-phenol substrate 4 are exposed at bottom surfaces of the hollow portions 32, in the same manner as in FIG. 2 above.

In this case, also, though not shown, the through-hole 33 is filled with a copper paste 6, followed by drying and thermal curing to form a plated-through hole which electrically connects the copper foil lands 31 provided on both sides of the paper-phenol substrate 4.

At this time, the copper paste 6 filling the hollow portions 32 provided in the periphery of the through-hole 33 is also cured in adhesion to the rough surfaces 5 of the paper-phenol substrate 4 constituting the bottom surfaces of the hollow portions 32.

Therefore, in this case also, an anchoring effect is obtained between the rough surfaces 5 constituting the bottom surfaces of the hollow portions 32 and the copper paste 6, whereby the adhesion strength between the copper paste 6 and the copper foil lands 31 becomes rigid.

Furthermore, since the hollow portions 32 are formed in the periphery of the through-hole 33 where exfoliation of the copper lands 31 would hitherto occur, there is no possibility of the exfoliation of the copper paste 6 from the copper foil lands 31, and reliability of connection between the copper paste 6 and the copper foil lands 31 can be enhanced.

By this, it is possible to realize a copper plated-through hole printed wiring board utilizing the inexpensive paper-phenol substrate 4.

Next, an example of the method of manufacturing a printed wiring board according to the present embodiment will be described referring to schematic views of FIGS. 8 to 12.

In this embodiment, description is made, as an example, of production steps for producing the printed wiring board according to the first embodiment described above.

Figure 8:
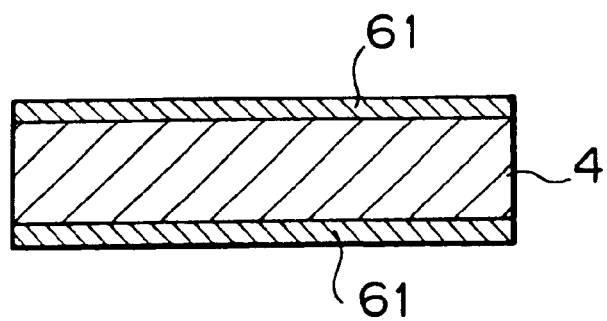
FIG. 8 is a view schematically showing a production step of the printed wiring board according to the first embodiment.

First, in this embodiment, as shown in FIG. 8, a both side copper-clad laminate comprising copper foils 61 adhered to both sides of a paper-phenol substrate 4 is used.

Figure 9:
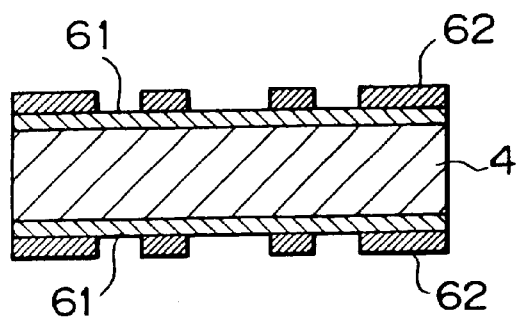
FIG. 9 is a view schematically showing a production step subsequent to FIG. 8.

In a pattern printing step, etching resist films (positive pattern) 62 are formed on the copper foils 61 of the both side copper-clad laminate, as shown in FIG. 9.

Here, the patterns of the etching resist films 62 include not only circuit patterns 63 for forming circuits and patterns for forming the outer periphery of the copper foil lands 1 but also patterns for forming ring-formed hollow portions 2 by removing the copper foils.

Namely, here, the step of forming copper foil lands 1 on the both side copper-clad laminate and the step of forming the ring-formed hollow portions 2 in the copper foil lands 1 are carried out simultaneously.

Figure 10:
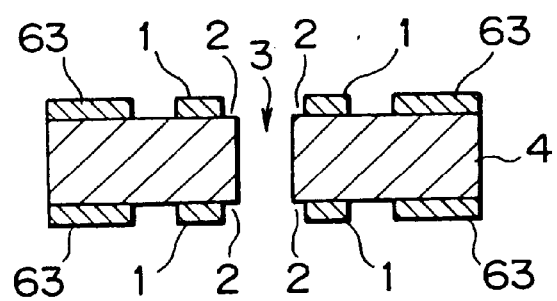
FIG. 10 is a view schematically showing a production step subsequent to FIG. 9.

Next, exposed portions of the copper foils 61 are subjected to etching, and the etching resist is removed, whereby the ring-formed hollow portions 2 are formed simultaneously with the circuit patterns 63 and the copper foil lands 1, as shown in FIG. 10.

Subsequently, a through-hole 3 to be plated-through hole is formed by using, for example, an NC multi-spindle drilling machine, whereby copper foil lands 1 provided with the ring-formed hollow portions 2 in contact with the through-hole 3 are completed.

Thereafter, in order to enhance adhesion strength between the copper foil lands 1 and the copper paste 6, the surfaces of the copper foil lands 1 are subjected to buffing for roughening, acid cleaning by diluted sulfuric acid and the like.

Figure 11:
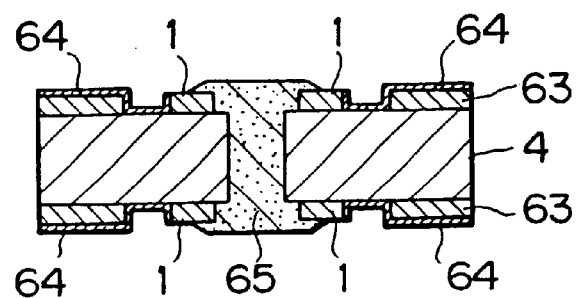
FIG. 11 is a view schematically showing a production step subsequent to FIG. 10.

Next, as shown in FIG. 11, a solder resist 64 is printed on the other portions than the copper foil lands 1, a curing treatment is carried out, then the inside of the through-hole 3 is filled with a copper paste 65 and the surfaces of the copper foil lands 1 are coated with the copper paste 65.

By applying the copper paste 65 to the surfaces of the copper foil lands 1 in this manner, the inside of the ring-formed hollow portions 2 are also filled with the copper paste 65.

Figure 12:
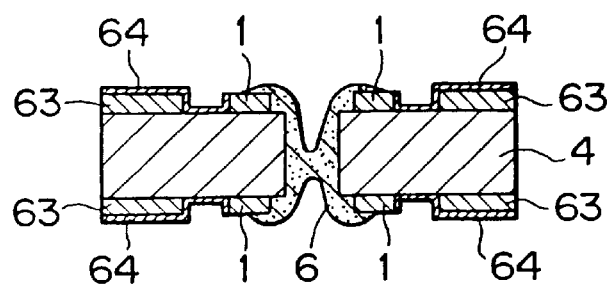
FIG. 12 is a view schematically showing a production step subsequent to FIG. 11.
Figure 13:
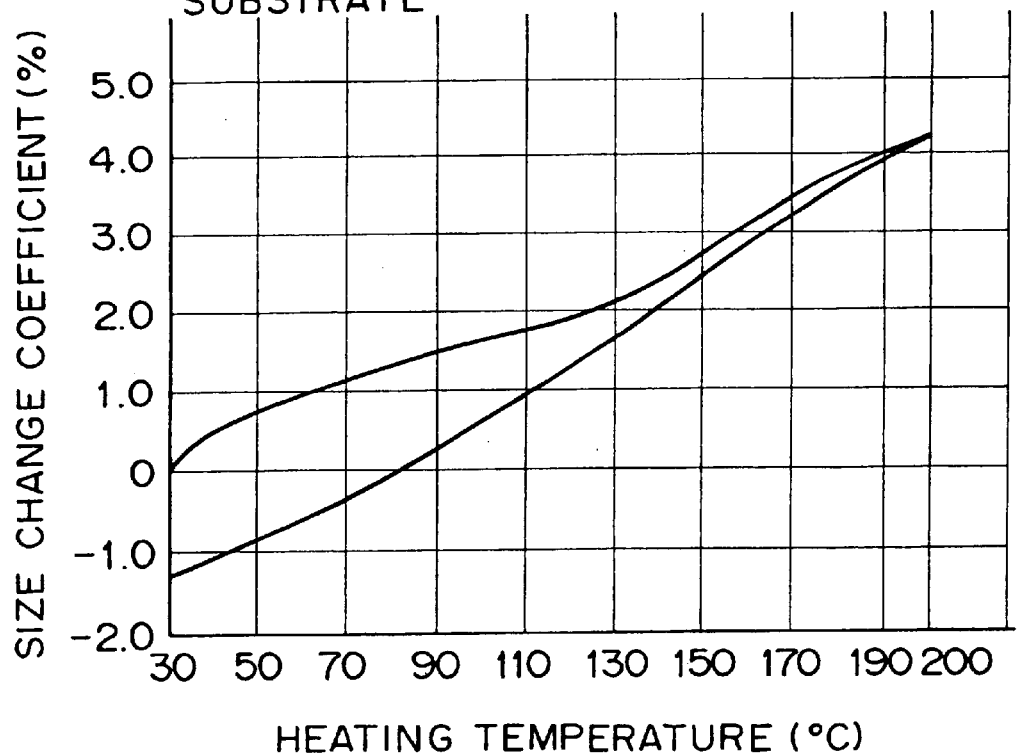
FIG. 13 is a diagram showing an example of thermal expansion and contraction characteristics of a paper-phenol substrate.
Figure 14:
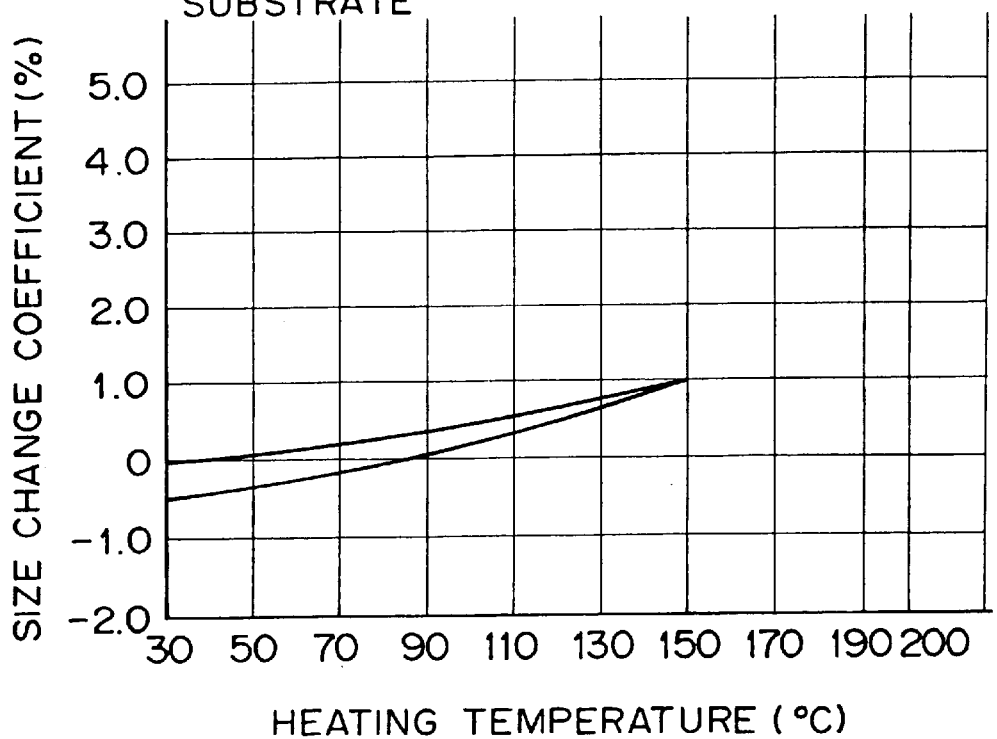
FIG. 14 is a diagram showing an example of thermal expansion and contraction characteristics of a glass-epoxy substrate.
Figure 15:
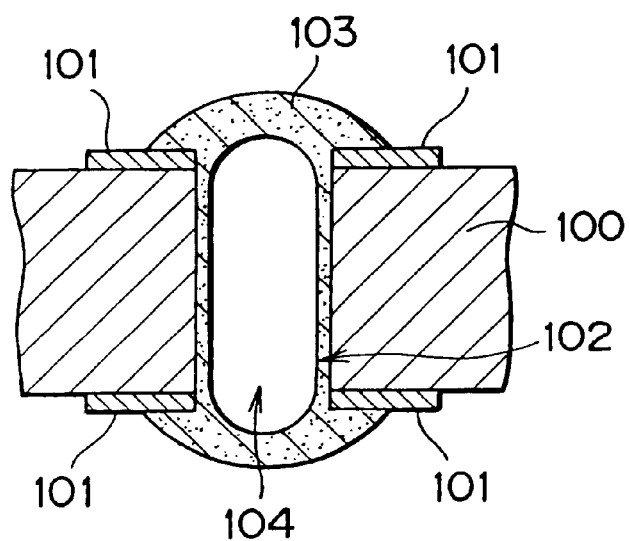
FIG. 15 is a view schematically showing the structure of a plated-through hole in a printed wiring board according to the related art.
Figure 16:
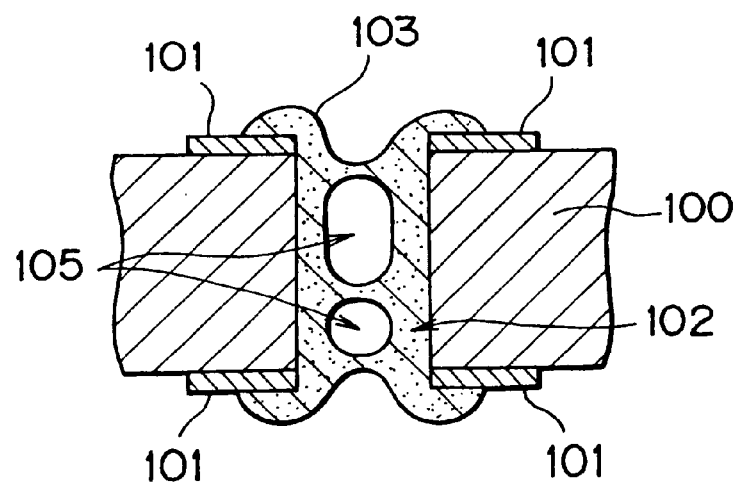
FIG. 16 is a view schematically showing the structure of a plated-through hole in a printed wiring board according to the related art.
Figure 17:
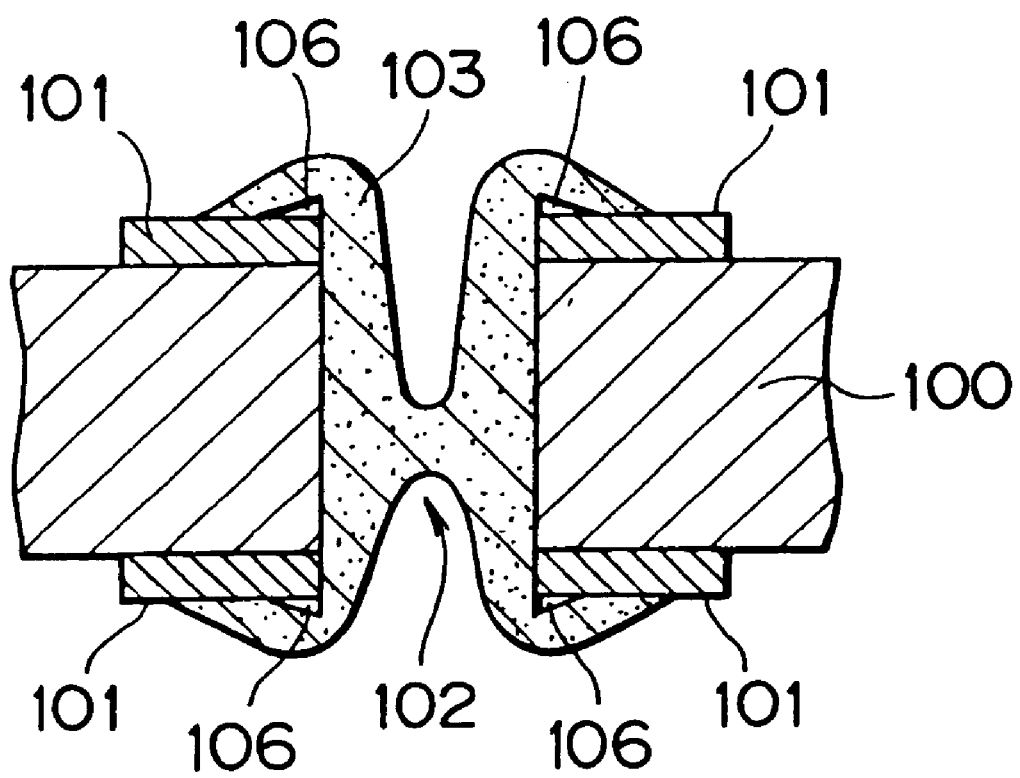
FIG. 17 is a view schematically showing the structure of a plated-through hole in a printed wiring board according to the related art.

After the through-hole 3 and the ring-formed hollow portions 2 are filled with the copper paste 65 and the surfaces of the copper foil lands 1 are coated with the copper paste 65, a drying step at about 60 to 100° C. and a thermal curing step at 150 to 160° C. are carried out, whereby as shown in FIG. 12, the copper paste 65 is cured, the copper foil lands 1 provided on both sides of the paper-phenol substrate 4 are electrically connected by the copper paste 65, and a copper plated-through hole printed wiring board as shown in FIGS. 3 and 4 is produced.

Therefore, according to such a method of manufacturing the printed wiring board as described above, the step of providing the copper foil lands 1 with the ring-formed hollow portions 2 is carried out at the same time with the step of forming the circuit patterns 63 and the copper foil lands 1, so that this process can be realized by only changing the resist pattern and without adding a step.

The present applicant et al. conducted destructive tests such as solder heat resistance after moisture absorption, on the printed wiring board produced by the method of producing a printed wiring board described above.

As a result, it was confirmed that exfoliation would not occur between the copper paste 65 and the copper foil lands 1 even in the case of using the paper-phenol substrate 4.

In addition, it was found that, as to the maximum conduction resistance of the plated-through hole, a stable resistance value can be obtained as compared with that obtained according to the related art.

The shapes of the copper foil removed portions described in the present embodiment are only examples, and the copper foil removed portions in the printed wiring board according to the present invention are not limited to these shapes; the copper foil removed portions may assume any shape as far as at least a portion thereof is in contact with the through-hole in the copper foil lands provided with the through-hole to be filled with a conductive paste.

While the base substrate has been described to be a paper-phenol substrate in the present embodiment, this is only an example, and the same effect can be obtained with a printed wiring board using as the base substrate a paper base material, for example, a paper-epoxy substrate produced by impregnating a paper base material with an epoxy resin, and a paper-epoxy composite material consisting of a glass material and a paper-epoxy material.

Further, while the copper paste has been described as an example of the conductive paste in the present embodiment, a silver paste prepared by kneading a silver powder with a thermosetting resin and the like may, for example, be used as the conductive paste in the present invention.

Furthermore, while the present embodiment has been described by taking a both side printed wiring board as an example, the both side printed wiring board is not limitative, and the present invention can be applied to a pattern for electrical connection between inside layers in a multilayer printed wiring board.

Besides, while the case of producing a printed wiring board according to the first embodiment has been taken as an example in the method of producing a printed wiring board according to the present embodiment, the printed wiring boards according to the second to fourth embodiments described above and the printed wiring board according to other embodiments can naturally be produced by the production steps shown in FIGS. 8 to 12.

As has been described above, in the printed wiring board according to the present invention, the copper foil lands provided with a through-hole to be filled with a conductive paste are provided with copper foil removed portions of a predetermined shape in contact with at least a portion of the through-hole, whereby adhesion strength between the conductive paste and the copper foil removed portions is enhanced.

Particularly, in the present invention, the bottom surfaces of the copper foil removed portions are rough surfaces, which offers an anchoring effect whereby the adhesion strength between the conductive paste and the copper foil lands can be made more rigid.

Besides, the copper foil removed portions are provided in the periphery of the through-hole where exfoliation of the copper foil lands would hitherto easily occur, whereby there is little possibility of exfoliation between the conductive paste and the copper foil lands.

Therefore, according to the printed wiring board of the present invention, exfoliation between the conductive paste and the copper foil lands would not occur, and reliability of connection between the conductive paste and the copper foil lands can be largely enhanced, so that it is possible to realize a copper plated-through hole printed wiring board utilizing an inexpensive paper base material as a base substrate.

Besides, according to the method of manufacturing the printed wiring board of the present invention, the step of forming the copper foil removed portions can be carried out simultaneously with the step of forming ordinary circuit patterns and the outer periphery of the copper foil lands, so that the process can be realized by only changing the resist pattern without a rise in cost.

What is claimed is:

1. A printed wiring board formed by a laminate comprising a paper-phenol substrate clad on two surfaces with a metallic foil, wherein a pair of metallic foil lands are located on opposite sides of said two surfaces of said paper-phenol substrate and are each provided around a through-hole filled with a conductive paste, each said land having a metallic-foil-removed portion having a rough surface and in the form of one of a ring in contact with and completely surrounding said through-hole and a plurality of slits radiating from and in contact with said through-hole, whereby said metallic-foil-removed portion enhances an adhesion strength between said pair of metallic foil lands and said conductive paste.

2. The printed wiring board as set forth in claim 1, wherein said conductive paste is a copper paste.

* * * * *